United States Patent [19]
Isa

[11] Patent Number: 6,075,749
[45] Date of Patent: Jun. 13, 2000

[54] SEMICONDUCTOR MEMORY DEVICE

[75] Inventor: Satoshi Isa, Tokyo, Japan

[73] Assignee: NEC Corporation, Tokyo, Japan

[21] Appl. No.: 09/123,447

[22] Filed: Jul. 28, 1998

[30] Foreign Application Priority Data

Jul. 29, 1997 [JP] Japan .................................. 9-203123

[51] Int. Cl.[7] .................................................. G11C 8/00
[52] U.S. Cl. ................ 365/233; 365/230.08; 365/189.05
[58] Field of Search .............................. 365/233, 189.05, 365/230.08, 230.06; 327/291

[56] References Cited

U.S. PATENT DOCUMENTS

| | | | |
|---|---|---|---|
| 5,808,961 | 9/1998 | Sawada | 365/233 |
| 5,896,341 | 4/1999 | Takahashi | 365/230.06 |
| 5,898,331 | 4/1999 | Fujita | 327/291 X |

FOREIGN PATENT DOCUMENTS 913587   1/1997   Japan .

*Primary Examiner*—Huan Hoang
*Attorney, Agent, or Firm*—Sughrue, Mion, Zinn, Macpeak & Seas, PLLC

[57] ABSTRACT

A semiconductor memory device comprises: an internal clock signal generating circuit that generates first and second internal clock signals for the internal timing control in response to an external clock; a first latch circuit that includes a first switching means to operate synchronously with the first internal clock signal and latches a plurality of command control signals for the internal operation control and outputs a plurality of latch command signals; a command decoding circuit that decodes the plurality of latch command signals and outputs a plurality of command decode signals; and a latch circuit that includes a second switching means to operate synchronously with the second internal clock signal, latches the plurality of command decode signals and outputs a plurality of predetermined mode signals. The internal clock signal generating circuit comprises a timing setting means for setting a timing between the first and second internal clock signals, and a clock width adjusting means for adjusting a pulse width of the first internal clock signal according to the timing of the second internal clock signal.

11 Claims, 14 Drawing Sheets

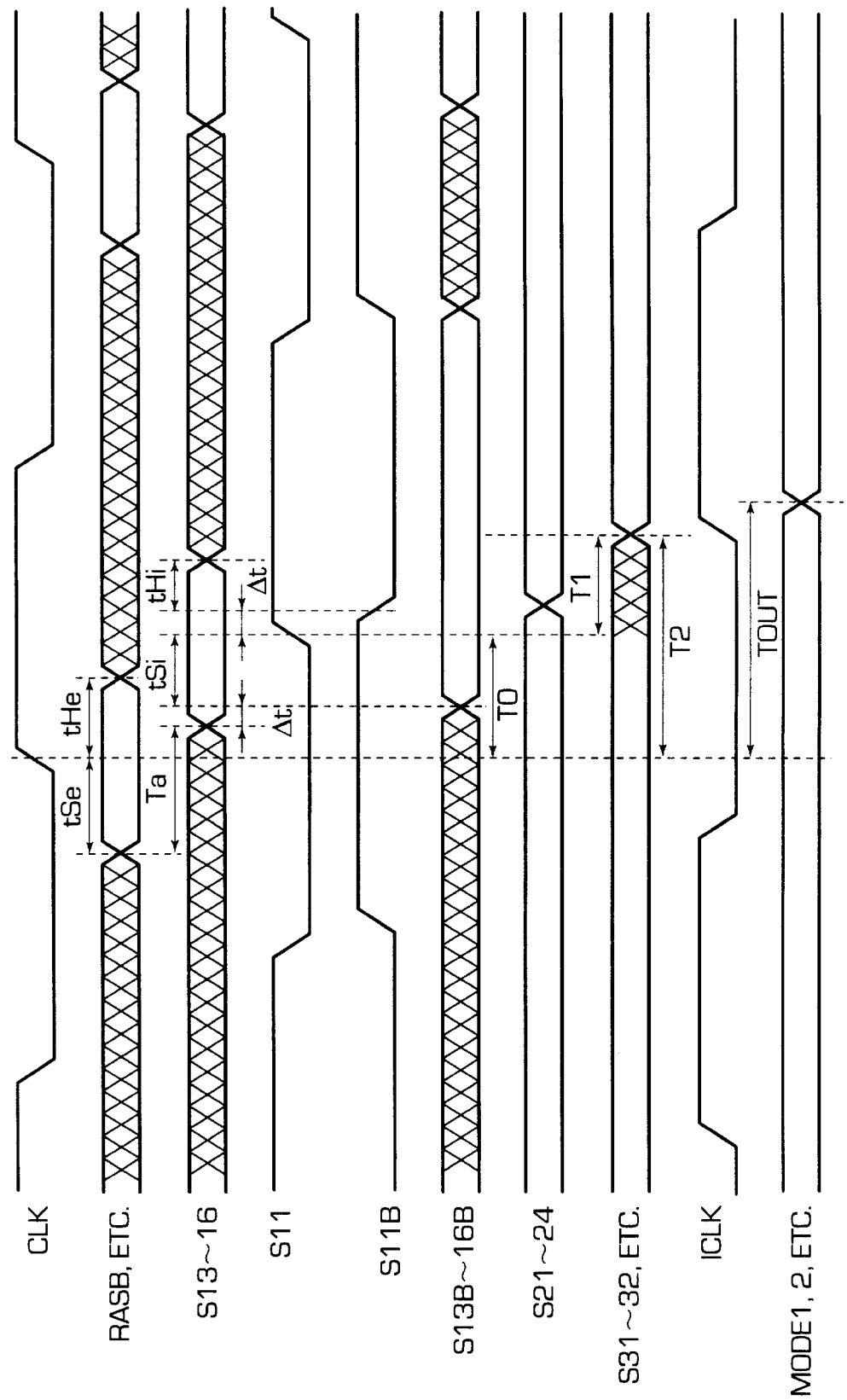

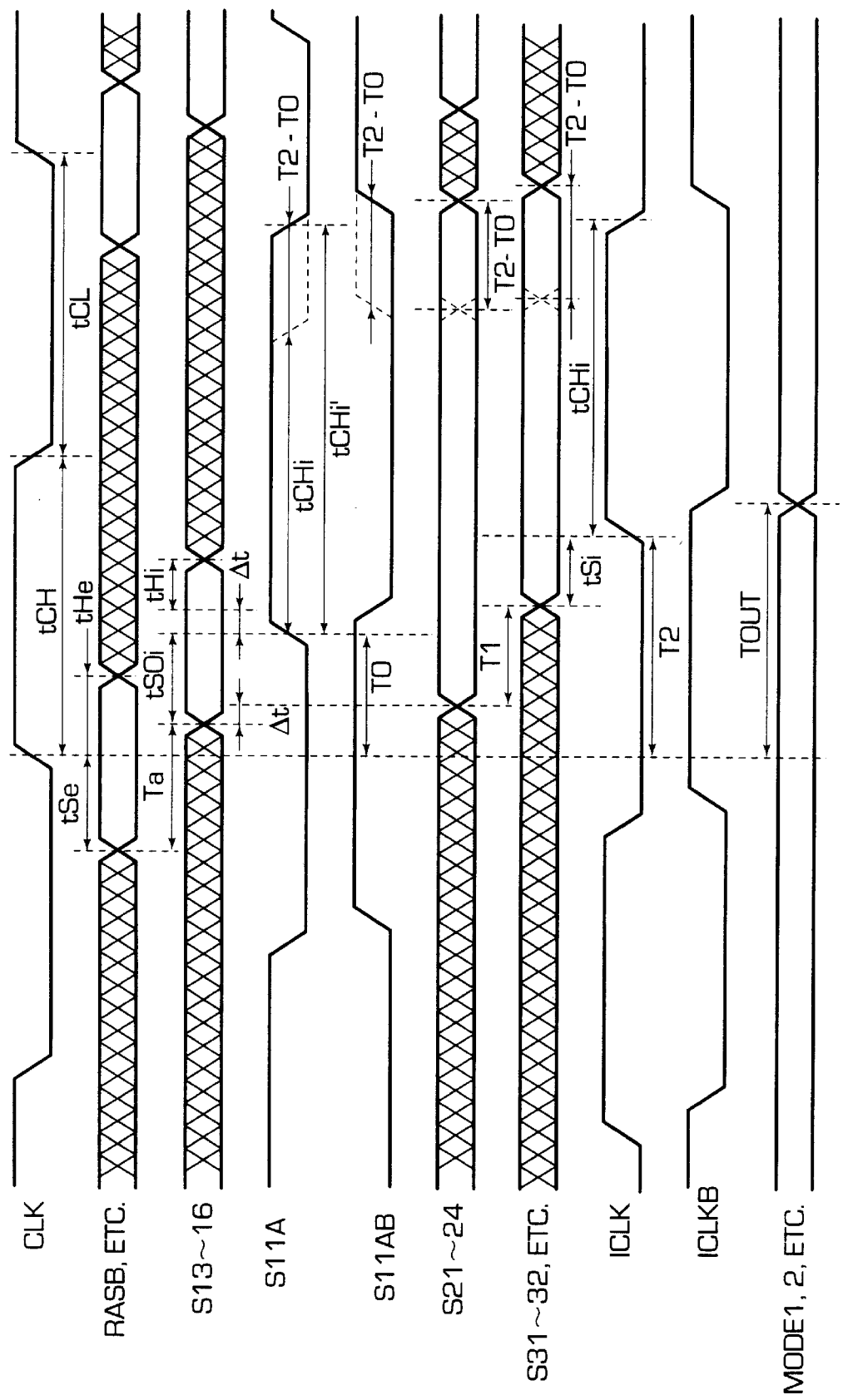

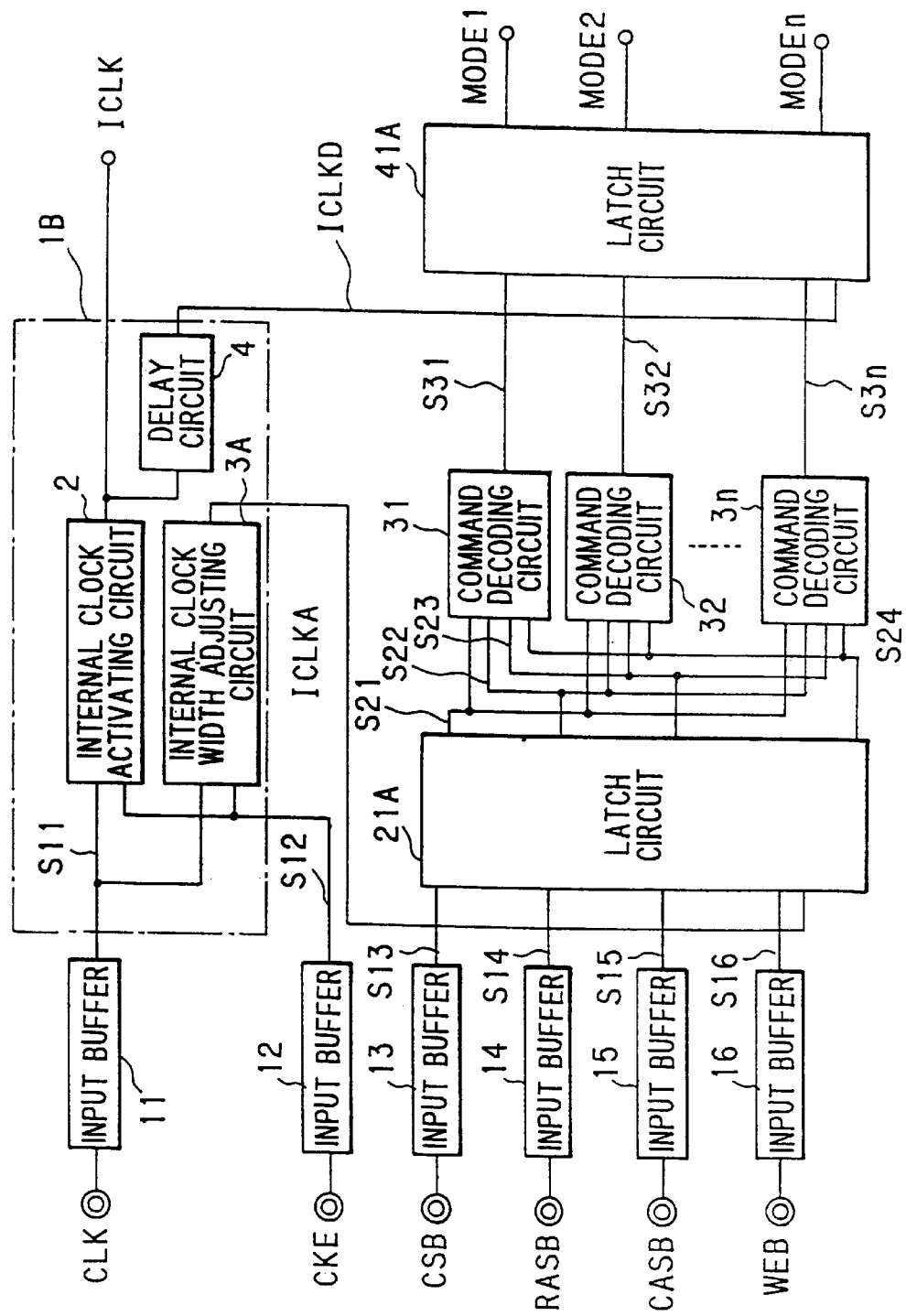

SEMICONDUCTOR MEMORY DEVICE

FIELD OF THE INVENTION

This invention relates to a semiconductor memory device, and more particularly to, a synchronous DRAM type semiconductor memory device that an input of address and command and an input-output of data are conducted synchronously with an external clock.

BACKGROUND OF THE INVENTION

Recently, a synchronous DRAM to synchronize with a 200 MHz or higher frequency external clock has been developed with an increase in operation speed of DRAMS. In such a synchronous DRAM, severer than those of the conventional DRAMs standards as to setup time and hold time characteristics of a command signal etc. relating to synchronous operation will be required.

Japanese patent application laid-open No.9-13587 (1997), which is filed by the assignee of this application, has proposed a semiconductor memory device (hereinafter referred to as first conventional semiconductor memory device'). In the first conventional semiconductor memory device, an external clock CLK, external command control signals such as external clock enable CKE, chip select CSB, row address strobe RASB, column address strobe CASB and write enable WEB, and addresses A0 to Ai are supplied. Also, data DQ0 to DQj as data signals are supplied to a data input and output terminal. Here, 'B' attached to the respective signal names means a Low level enable signal to activate at Low level. In write and read operations, by using a rising edge of external clock CLK as a reference, the inputting of the address and various command control signals and the inputting and outputting of data are conducted.

Referring to FIG. 1, the first conventional semiconductor memory device is composed of an internal clock generating circuit 1 that generates an internal clock ICLK for the operation timing control within the memory device in response to an external clock CLK supplied, input buffers 12 to 16 that buffer and amplify the respective command control signals CKE, CSB, RASB, CASB and WEB and output corresponding internal signals S12 to S16, register circuits 121 to 124 that latch and hold the respective internal signals S13 to S16 corresponding to the command control signals CSB, RASB, CASB and WEB and output corresponding latch signals S21 to S24, command decoding circuits 31, 32, . . . that decode the command control signals in response to the latch signals S21 to S24 supplied and output command decode signals S31, S32, . . . , and D-type latch circuits 41, 42, . . . that latch the command decode signals S31, S32, . . . and output corresponding operation mode judgement signals MODE1, MODE2, . . . .

The internal clock generating circuit 1 is composed of an input buffer 11 that buffers and amplifies the external clock CLK and outputs a corresponding internal clock S11, and an internal clock activating circuit 2 that is activated in response to signal S12 supplied and generates the internal clock ICLK while synchronizing with the internal clock S11.

Referring to FIGS. 1 and 2, the operation of the first conventional semiconductor memory device will be explained below. FIG. 2 is a time chart showing the operation waveforms of the respective signals.

First, the input buffer 11 receives the external clock CLK, and then outputs in-phase clock S11 with CMOS level according to Low level/High level of CLK, regardless of the level of the external clock enable signal CKE. The internal clock activating circuit 2 is activated in response to High level of the output signal S12 of the input buffer 12 supplied with CKE, receiving clock S11, then outputting the internal clock ICLK to synchronize with clock S11 to the internal circuit.

The input buffers 13 to 16 receive the respective command control signals CSB, RASB, CASB and WEB and then output the corresponding internal signals S13 to S16. The register circuits 121 to 124 latch and hold the internal signals S13 to S16 while synchronizing with the rising edge of the internal clock S11 corresponding to the external clock, and then output the internal signals S21 to S24 to the command decoding circuits 31, 32, . . . . The command decoding circuits 31, 32, . . . output the command decode signals S31, S32, . . . that correspond to the combinations of level states of the internal signals S21 to S24 to the latch circuits 41, 42, . . . . The latch circuits 41, 42, . . . latch the command decode signals S31, S32, . . . while synchronizing with the internal clock ICLK, and then output the corresponding operation mode judgement signals MODE1, MODE2, . . . .

Though the final judgement of operation mode in the command decode circuits 31, 32, . . . actually uses the address signals, their explanations are omitted herein, as a matter of convenience for explanation. Also, in fact, between Low level and High level of the external signal, the propagation delays from input pads to the latch circuits are not equal, but they are treated as equal, as a matter of convenience for explanation.

Referring to FIG. 2, particularly, the operation timing will be detailed below. With High level of the external clock enable signal CKE, the external clock CLK becomes effective. Also, the respective external command control signals CSB, RASB, CASB, WEB etc. are input having an external setup time tSe and an external hold time the to the external clock CLK. Thus, signals S13 to S16 are varied delaying by a buffer delay Ta, i.e., a delay in passing through the input buffers 13 to 16 and a delay raised by wiring etc., to each of the external command control signals CSB, RASB, CASB and WEB. Then, signals S13 to S16 are latched and held by the register circuits 121 to 124 while synchronizing with the rising edge of the internal clock S11.

Then, the command decode signals S31, S32, . . . are varied delaying by a decode time T1, i.e., a delay in passing through the command decoding circuits 31, 32, . . . and a delay caused by wiring etc. Then, the latch circuits 41, 42, . . . , as described earlier, latch these command decode signals S31, S32, . . . while synchronizing with the internal clock ICLK and output the operation mode judgement signals MODE1, MODE2, . . . .

Thus, the reason why the latch circuits 41, 42, . . . are provided is to prevent an interference, such as noise and hazard, to the operation mode judgement signals.

Now, considered is a mode judgement time Tout from the inputting an internal window width tWi as the sum of an internal setup time tSi and an internal hold time tHi of chip and the external clock CLK until the outputting of the operation mode signal. This mode judgement time Tout affects an access time.

First, referring to FIGS. 1, 2 and 3A that shows, specifically as a matter of convenience for explanation, the details of the register circuit 121, command decoding circuit 31 and D-type latch circuit 41, the mode judgement operation of the first conventional semiconductor memory device will be detailed below.

The register circuit 121 is composed of master and slave D-type latches 21, 22 that include transfer gates SW1, SW2, respectively composed of PMOS and NMOS transistors. The latch 41 is a D-type latch that includes a transfer gate SW3.

Also, as a matter of convenience for explanation, the internal setup time tSi and the internal hold time tHi are defined as follows: Namely, the internal setup time tSi is a time from the determining the level of an input signal S13B' to the slave D-type latch 22 until the opening of the transfer gate SW2. On the other hand, the internal hold time tHi is a time from the closing of the transfer gate SW1 of the master D-type latch 21 until the varying from a determined state of an input signal S13 on the master side.

Also, both a signal propagation time of the D-type latch and a time required to generate complementary clocks S11B, ICLKB to the clock S11 and internal clock ICLK, respectively are defined as $\Delta t$.

Referring to FIG. 2, the external setup time tSe and external hold time the, and the internal window width tWi are given by the following expressions, where the internal window width tWi is $2*\Delta t$ smaller than an external window width tWe.

$$tSe+tHe=\Delta t+tSi+\Delta t+tHi \qquad [1]$$

$$tWi=tWe-2*\Delta t \qquad [2]$$

On the other hand, the mode judgement time Tout is given by the following expression, where T2 represents a delay time from the external clock CLK to the internal clock ICLK.

$$Tout=T2+\Delta t \qquad [3]$$

Namely, in low-speed operation, as to the standard of setup time and hold time, the reduction in window width can be a negligible level, compared with the window width. However, in 200 MHz or more high-frequency operation, the reduction in window width cannot be neglected.

Next, a second conventional semiconductor memory device will be explained in FIG. 4, wherein like parts are indicated by like reference numerals and letters as used in FIG. 1. The difference between the first conventional semiconductor memory device and the second conventional semiconductor memory device is that latch timing is synchronized with the internal clock ICLK instead of the register circuits 121 to 124, and D-type latch circuits 21 to 24 are provided having a master-slave relation with the latch circuits 41, 42, . . . on the output side.

Referring to FIGS. 4 and 5, the operation of the second conventional semiconductor memory device will be explained below. FIG. 5 is a time chart showing the operation waveforms of the respective signals.

First, like the first conventional semiconductor memory device, the input buffer 11 receives the external clock CLK, and then the internal clock activating circuit 2 is activated in response to an internal signal S12 supplied. Also, the input buffers 13 to 16 receive the respective command control signals CSB, RASB, CASB and WEB and then output the corresponding internal signals S13 to S16. The fatch circuits 21 to 24 latch and hold the internal signals S13 to S16 while synchronizing with the rising edge of the internal clock ICLK and then output the internal signals S21 to S24 to the command decoding circuits 31, 32, . . . .

In this composition, the internal hold time tHi is defined by the master latch circuits 21 to 24, and the internal hold time tSi is defined by the slave latch circuits 41, 42, . . . .

Referring to FIG. 5, particularly, the operation timing will be detailed below. Like the first conventional semiconductor memory device, with High level of the external clock enable signal CKE, the external clock CLK becomes effective. Also, the respective external command control signals CSB, RASB, CASB, WEB etc. are input with having an external setup time tSe and an external hold time tHe to the external clock CLK. Thus, signals S13 to S16 are varied delaying by a buffer delay Ta in the input buffers 13 to 16 to each of the external command control signals CSB, RASB, CASB and WEB.

Then, the command decode signals S31, S32, . . . are varied delaying by a delay $\Delta t$ in passing through the master latch circuits 21 to 24 and a decode time T1 of the command decoding circuits 31, 32, . . . . Then, the slave latch circuits 41, 42, . . . latch these command decode signals S31, S32, . . . while synchronizing with the internal clock ICLK and output the operation mode judgement signals MODE1, MODE2, . . . .

Referring to FIGS. 4, 5 and 3B that shows, specifically as a matter of convenience for explanation, the details of the latch 21, command decoding circuit 31 and D-type latch circuit 41, the mode judgement operation of the second conventional semiconductor memory device will be detailed below.

The latch 21 is composed of a master D-type latch that includes a transfer gate SW1. The latch 41 is composed of a slave D-type latch that includes a transfer gate SW3. The other components are similar to those in the first conventional semiconductor memory device.

The internal setup time tSi is defined as a time from the determination of the level of an input signal S31 to the slave D-type latch until the opening of the transfer gate SW3. On the other hand, the internal hold time tHi is defined as a time from the closing of the transfer gate SW1 of the master D-type latch until the varying from a determined state of input signal S13 on the master side.

Again referring to FIG. 5, the external setup time tSe and external hold time tHe, and the internal window width tWi are given by the following expressions, where the internal window width tWi is $(2*\Delta t+T1)$ smaller than the external window width tWe.

$$tSe+tHe=\Delta t+T1+tSi+\Delta t+tHi \qquad [4]$$

$$tWi=tWe-(2*\Delta t+T1) \qquad [5]$$

where T1 represents the decode time of the command decoding circuit 31.

On the other hand, the mode judgement time Tout is given by the following expression.

$$Tout=T2+\Delta t \qquad [6]$$

Also in this case, in low-speed operation, as to the standard of setup time and hold time, the reduction in window width can be a negligible level, compared with the window width. However, in 200 MHz or more high-frequency operation, the reduction in window width cannot be neglected.

As described above, in both the first conventional semiconductor memory device and the second conventional semiconductor memory device, the internal window width is reduced to the external window width to be determined by the standards of the external setup time and the external hold time. Thus, in 200 MHz or more high-frequency operation with a short window width, the reduction in window width cannot be neglected.

SUMMARY OF THE INVENTION

Accordingly, it is a first object of the invention to provide a semiconductor memory device having an internal window width longer than that of the conventional semiconductor memory device which can be provided for command control signals.

It is a second object of the invention to provide a semiconductor memory device that attains the first object of the invention while maintaining the operation mode judgement time from the inputting of an external clock CLK to the outputting of an operation mode judgement signal to be equal to that in the conventional semiconductor memory device.

It is a third object of the invention to provide a semiconductor memory device having the function that an internal window width and an operation mode judgement time can be set under a certain condition.

According to the invention, a semiconductor memory device, comprises:

an internal clock signal generating circuit that generates first and second internal clock signals for the internal timing control in response to the supplying of an external clock;

a first latch circuit that includes a first switching means to operate in synchronization with the first internal clock signal and D-type latches a plurality of command control signals for the internal operation control and outputs a plurality of latch command signals;

a command decoding circuit that decodes the plurality of latch command signals and outputs a plurality of command decode signals; and a second D-type latch circuit that includes a second switching means to operate in synchronization with the second internal clock signal, latches the plurality of command decode signals and outputs a plurality of predetermined mode signals;

wherein the internal clock signal generating circuit comprises a timing setting means for setting a timing between the first and second internal clock signals, and a clock width adjusting means for adjusting a pulse width of the first internal clock signal according to the timing of the second internal clock signal, the first latch circuit sets a hold time required from a time that the first switching means is turned on to a time that an input signal of the first latch circuit starts varying from a certain determined level, and the second D-type latch circuit sets a setup time required from a time that an input signal of the second D-type latch circuit reaches to a certain determined level to a time that the second switching means starts turning off.

BRIEF DESCRIPTION OF THE DRAWINGS

The invention will be explained in more detail in conjunction with the appended drawings, wherein:

FIG. 2 is a time chart showing the operation of the first conventional semiconductor memory device, FIG. 8 is a time chart showing the operation of the semiconductor memory device in the first embodiment, FIG. 14 is a block diagram showing a semiconductor memory device in a sixth preferred embodiment according to the invention.

DESCRIPTION OF THE PREFERRED EMBODIMENTS

Figure 1:
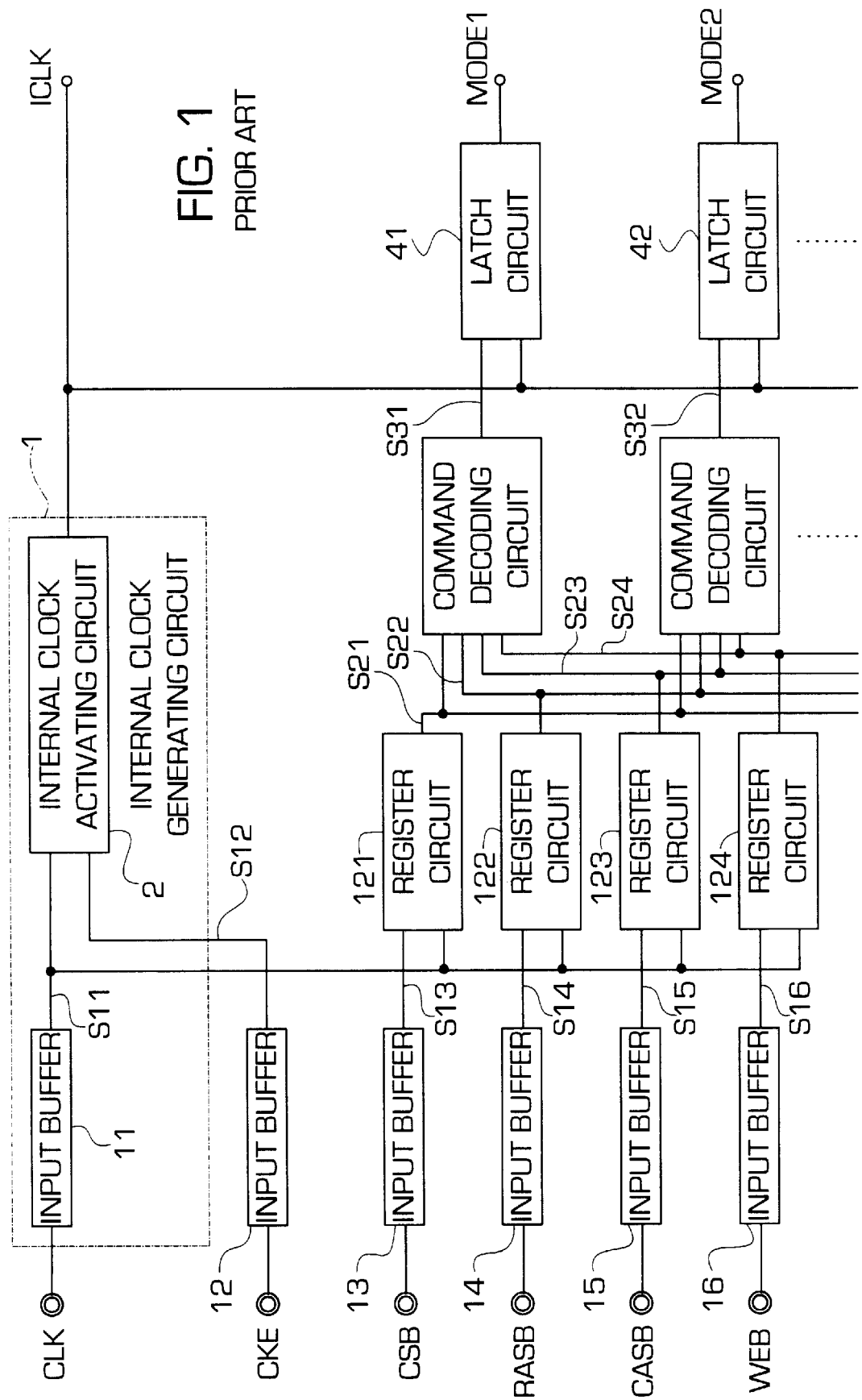
FIG. 1 is a block diagram showing the first conventional semiconductor memory device.
Figure 3A:
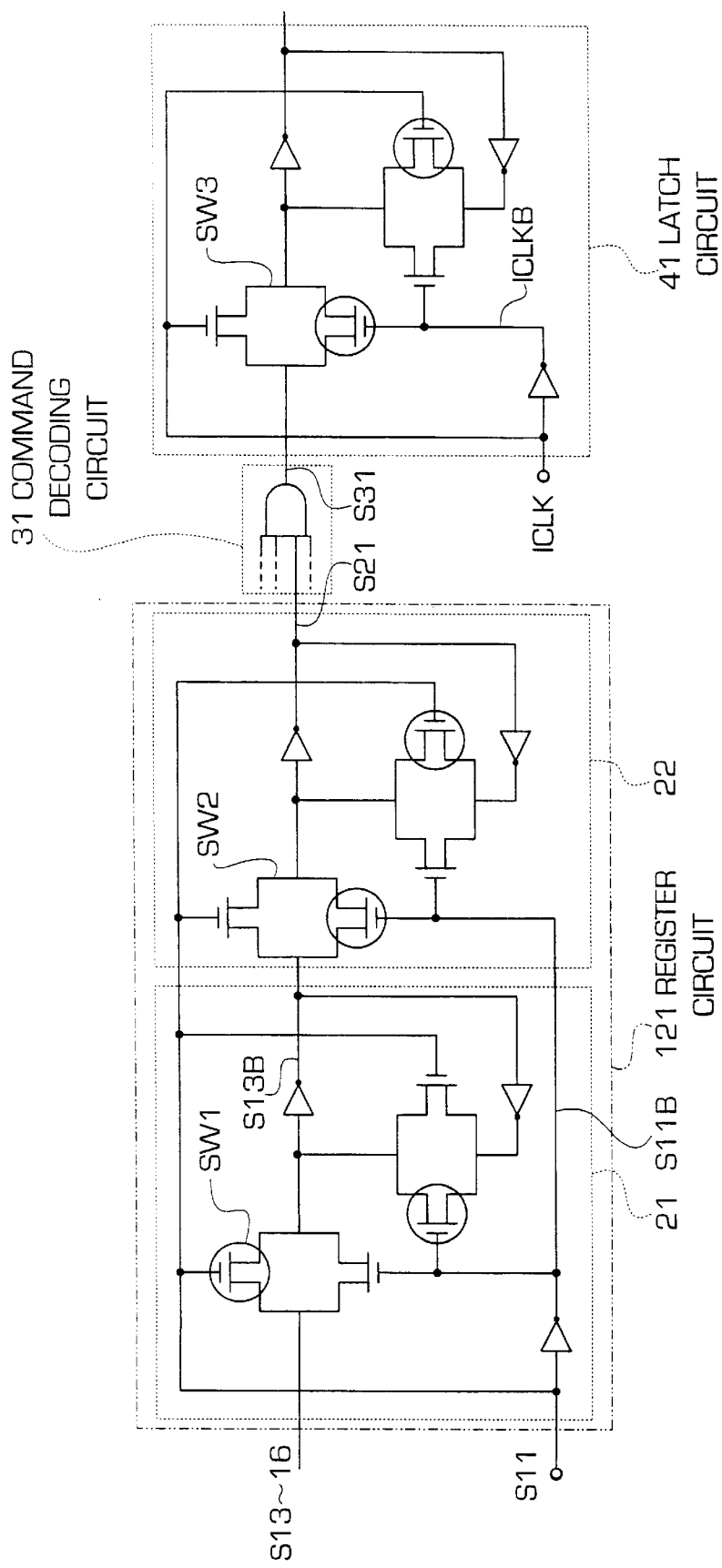
FIGS. 3A and 3B are circuit diagrams showing the detailed compositions of the register circuit, command decoding circuit and D-type latch circuit in the first and second conventional semiconductor device.
Figure 3B:
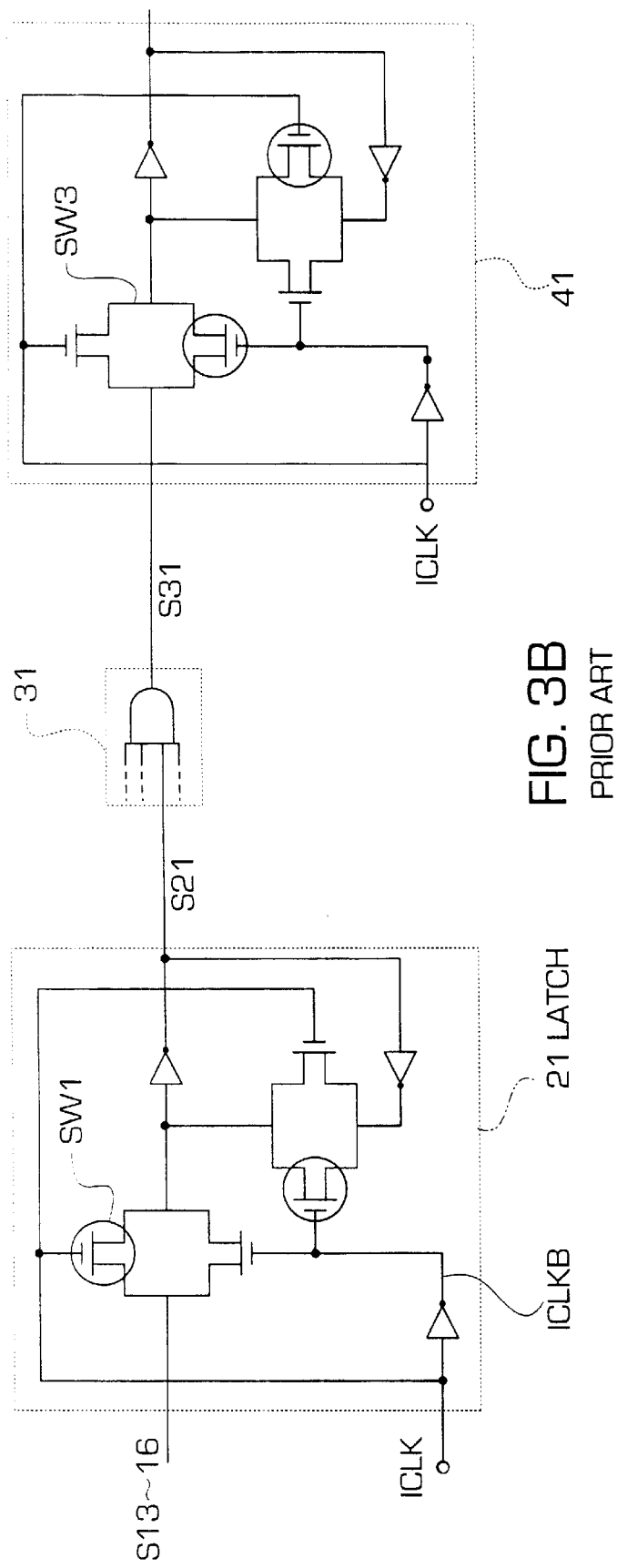
Figure 4:
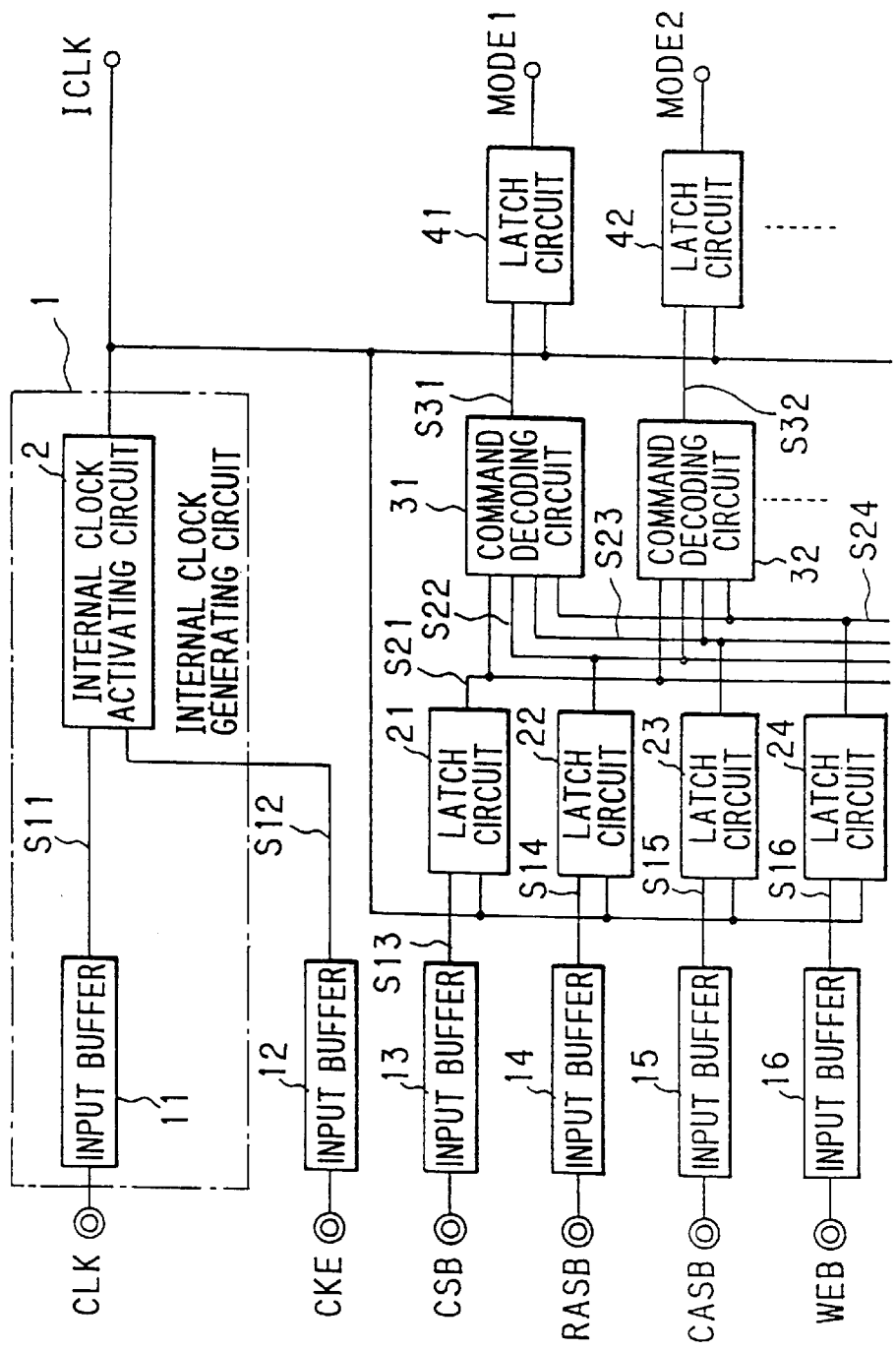
FIG. 4 is a block diagram showing the second conventional semiconductor memory device.
Figure 5:
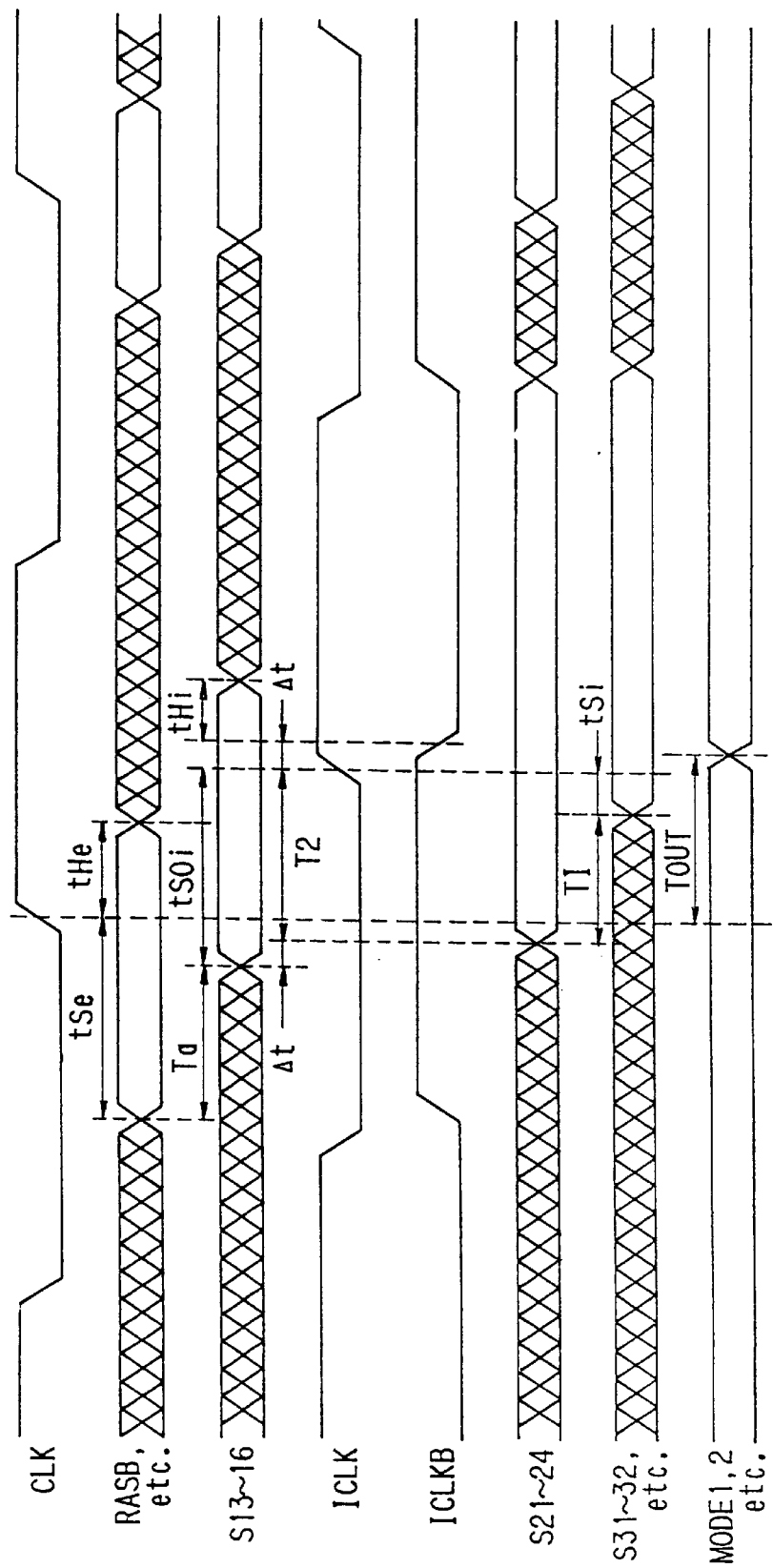
FIG. 5 is a time chart showing the operation of the second conventional semiconductor memory device.

A semiconductor memory device in the first preferred embodiment according to the invention will be explained in FIG. 6, wherein like parts are indicated by like reference numerals and letters as used in FIGS. 1 and 4.

The semiconductor memory device in the first embodiment comprises input buffers 12 to 16 that buffer and amplify the respective command control signals CKE, CSB, RASB, CASB and WEB, which are common to those in the conventional techniques, and output corresponding internal signals S12 to S16, latch circuits 21 to 24 that latch and hold the respective internal signals S13 to S16 corresponding to the command control signals CSB, RASB, CASB and WEB and output corresponding latch signals S21 to S24, command decoding circuits 31, 32, . . . that decode the command control signals in response to the latch signals S21 to S24 supplied and output command decode signals S31, S32, . . . , latch circuits 41, 42, . . . that latch the command decode signals S31, S32, . . . and output corresponding operation mode judgement signals MODE1, MODE2, . . . , and an internal clock generating circuit 1A that generates an internal clock ICLK to control the operation timing within the memory device in response to an external clock CLK supplied as well as outputting a clock S11A with the pulse width adjusted.

The internal clock generating circuit 1A is composed of an input buffer 11 that outputs clock S11 common to that in the conventional techniques, an internal clock activating circuit 2 that is activated in response to signal S12 supplied and generates the internal clock ICLK while synchronizing with clock S11, and a clock width adjusting circuit 3 that outputs clock 11A to be generated adjusting the pulse width of clock S11.

Figure 7:
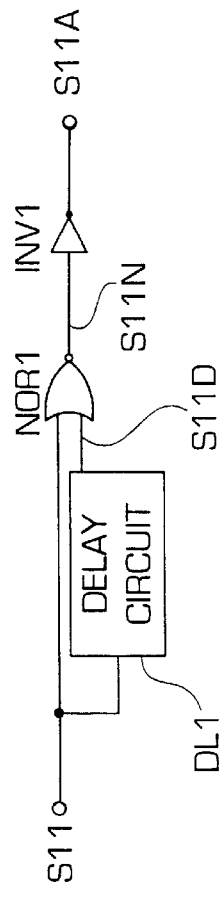
FIG. 7 is a circuit diagram showing a clock width adjusting circuit in FIG. 6.

Referring to FIG. 7, the clock width adjusting circuit 3 is composed of a delay circuit DL1 that delays clock S11 for a predetermined time and outputs a delay signal S11D, a NOR gate NOR1 that conducts the NOR operation of clock S11 and the delay signal S11D and outputs a NOR signal S11N, and a inverter INV1 that inverts the NOR signal S11N and outputs clock S11A.

Figure 6:
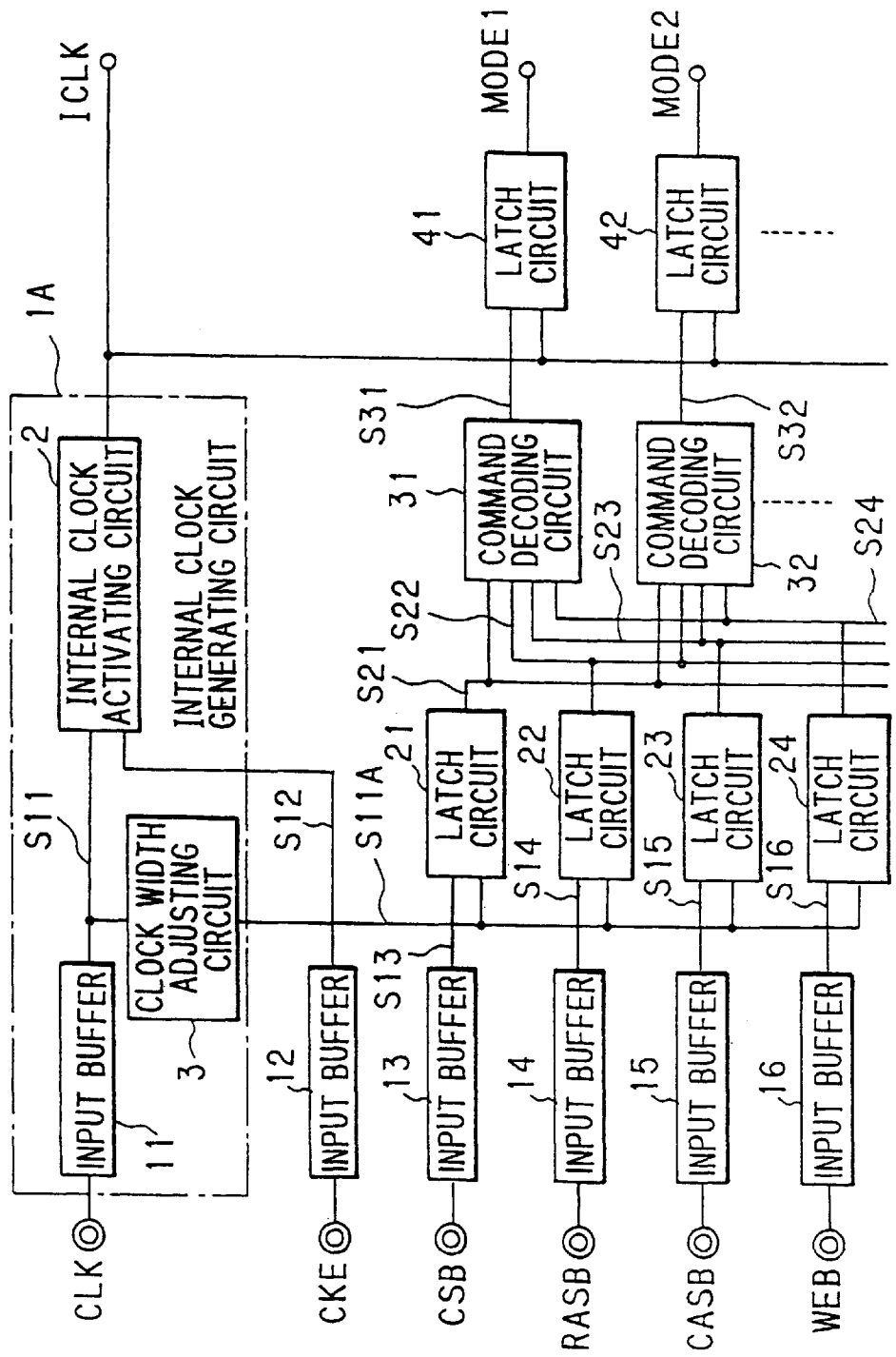
FIG. 6 is a block diagram showing a semiconductor memory device in a first preferred embodiment according to the invention.

Referring to FIGS. 6, 7 and 8, the operation of the semiconductor memory device in the first embodiment will be explained below. FIG. 8 is a time chart showing the operation waveforms of the respective signals.

First, like the conventional techniques, the input buffer 11 of the internal clock generating circuit 1A receives the external clock CLK, and then outputs in-phase clock S11 with CMOS level according to Low level/High level of CLK, regardless of the level of the external clock enable signal CKE. The internal clock activating circuit 2 is activated in response to High level of the output signal S12 of the input buffer 12 supplied with the external clock enable signal CKE, receiving clock S11, then outputting the internal clock ICLK to synchronize with clock S11 to the internal circuit.

The clock width adjusting circuit 3 receives clock S11, generating clock S11A while adjusting the width of a High level part, i.e., pulse width, to be longer than that of the internal clock ICLK as well as synchronizing with clock S11, then outputting it to the latch circuits 21 to 24. The specific operation and value in the adjusting of pulse width will be explained later.

Then, the input buffers 13 to 16 receive the respective command control signals CSB, RASB, CASB and WEB and then output the corresponding internal signals S13 to S16. The latch circuits 21 to 24 latch and hold the internal signals S13 to S16 while synchronizing with the rising edge of clock S11A supplied, and then output the internal signals S21 to S24 to the command decoding circuits 31, 32, . . . .

Subsequently, like the conventional techniques, the command decoding circuits 31, 32, . . . output the command decode signals S31, S32, . . . that correspond to the combinations of level states of the internal signals S21 to S24 to the latch circuits 41, 42, . . . . The latch circuits 41, 42, . . . latch the command decode signals S31, S32, . . . while synchronizing with the internal clock ICLK, and then output the corresponding operation mode judgement signals MODE1, MODE2, . . . .

Meanwhile, the latch circuits 21 to 24 adjust a time until latching the internal signals S13 to S16 corresponding to the command control signals CSB, RASB, CASB and WEB to be equal. Namely, the master-side latch circuits 21 to 24 set an internal hold time tHi while synchronizing with clock S11A, and the slave-side latch circuits 41, 42, . . . set an internal setup time tSi while synchronizing with the internal clock ICLK.

Again referring to FIG. 8, particularly, the operation timing will be detailed below. Like the conventional techniques, with High level of the external clock enable signal CKE, the external clock CLK becomes effective. Also, the respective external command control signals CSB, RASB, CASB, WEB etc. are input with having an external setup time tSe and an external hold time tHe to the external clock CLK. Thus, signals S13 to S16 are varied delaying by a buffer delay Ta in the input buffers 13 to 16 to each of the external command control signals CSB, RASB, CASB and WEB.

Then, as described earlier, signals S13 to S16 are latched and held by the latch circuits 21 to 24 while synchronizing with the rising edge of clock S11A, and then are output as the latch signals S21 to S24. The latch signals S21 to S24 are decoded by the command decoding circuits 31, 32, . . . , and then are output as the command decode signals S31, S32, . . . to the slave-side latch circuits 41, 42, . . . .

Meanwhile, the command decode signals S31, S32, . . . are varied delaying by a latch delay Δt in passing through the master-side latch circuits 21 to 24 and a decode time T1 of the command decoding circuits 31, 32, . . . . Then, the slave-side latch circuits 41, 42, . . . , as described earlier, latch these command decode signals S31, S32, . . . while synchronizing with the internal clock ICLK and output the operation mode judgement signals MODE1, MODE2, . . . .

The clock width adjusting circuit 3 adjusts the High level width tCHi' of clock S11A to the High level width tCHi of the internal clock ICLK so as to satisfy the follow expression:

$$tCHi' \geq tCHi + T2 - T0 \quad [7]$$

where T0 represents a delay time from the external clock CLK to clock S11A, and T2 represents a delay time from the external clock CLK to the internal clock ICLK.

Because, in case of the following relation, the slave-side latches 41, 42, . . . cause an error latching.

$$tCHi' < tCHi + T2 - T0 \quad [8]$$

The delay times T0 and T2 are given by:

$$T0 = Ta + tS0i - tSe \quad [9]$$

$$T2 = Ta + \Delta t + T1 + tSi - tSe \quad [10]$$

Thus, the difference (T2−T0) between the delay times T0 and T2 is given by:

$$T2 - T0 = T1 + \Delta t + tSi - tS0i \quad [11]$$

The internal setup width must be restricted by the correction internal setup time tS0i. Therefore, when the internal setup width is set by using the internal setup time tSi, it needs to satisfy the next expression:

$$tSi - tS0i \leq 0 \quad [12]$$

From the above relations, by setting the difference (T2−T0) between the delay times T0 and T2 to satisfy the following expressions 13A, 13B, expressions 14, 15 can be established, therefore the internal window width tWi can be made to be longer than conventional one, as shown in expression 16.

$$T2 - T0 = T1 + \Delta t \quad [13A]$$

$$tCHi' \geq tCHi + T1 + \Delta t \quad [13B]$$

$$tSe + tHe = tS0i + \Delta t + tHi \quad [14]$$

$$tSe + tHe = tSi + tHi + \Delta t \quad [15]$$

$$tWi = tWe - \Delta t \quad [16]$$

On the other hand, the operation mode judgement time Tout, i.e., a time from the inputting of the external clock CLK until the outputting of the operation mode judgement signal, is given by the following expression 17, and it is equal to the shortest time in the conventional techniques.

$$Tout = T2 + \Delta t \quad [17]$$

Also, by setting the difference (T2−T0) between the delay times T0 and T2 to satisfy the following expressions 18A, 18B, expressions 19, 20 can be established, therefore the internal window width tWi can be obtained as shown in expression 21.

$$T2 - T0 = T1 + \Delta t - t\alpha \quad [18A]$$

$$tCHi' = tCHi + T2 - T0 \quad [18B]$$

$$tSe + tHe = tS0i + \Delta t + tHi \quad [19]$$

$$tSe+tHe=tSi+t\alpha+tHi+\Delta t \quad [20]$$

$$tWi=tWe-(\Delta t+t\alpha) \quad [21]$$

where tα represents an arbitrary time.

On the other hand, the operation mode judgement time Tout is given by:

$$Tout=T2+\Delta t-t\alpha \quad [22]$$

As understood from the above expressions, there exists a trade-off relation between the internal window width tWi and the operation mode judgement time Tout. Namely, when the internal window width tWi is narrowed, the operation mode judgement time Tout is shortened by the reduced amount, tα. Thus, by adjusting the interrelation between the delay times T0 and T2, i.e., the timings of clock S11A and the internal clock ICLK, and the pulse width of clock S11A, the internal window width tWi and the operation mode judgement time Tout can be optimized under a certain condition.

A semiconductor memory device in the second preferred embodiment according to the invention will be explained in FIG. 9, wherein like parts are indicated by like reference numerals and letters as used in FIG. 6.

The second embodiment is different from the first embodiment in that it comprises an internal clock generating circuit 1B composed of a clock width adjusting circuit 3A, instead of the clock width adjusting circuit 3, that is activated in response to signal S12 corresponding to the supplying of the external clock enable signal CKE, adjusting a clock width, generating clock ICLKA, and a delay circuit 4 that delays the internal clock ICLK for a predetermined time, outputting a delayed internal clock ICLKD. The latch timing of the latch circuits 21 to 24 is controlled by clock ICLKA, and the latch timing of the latch circuits 41, 42, . . . is controlled by the delayed internal clock ICLKD.

Figure 9:
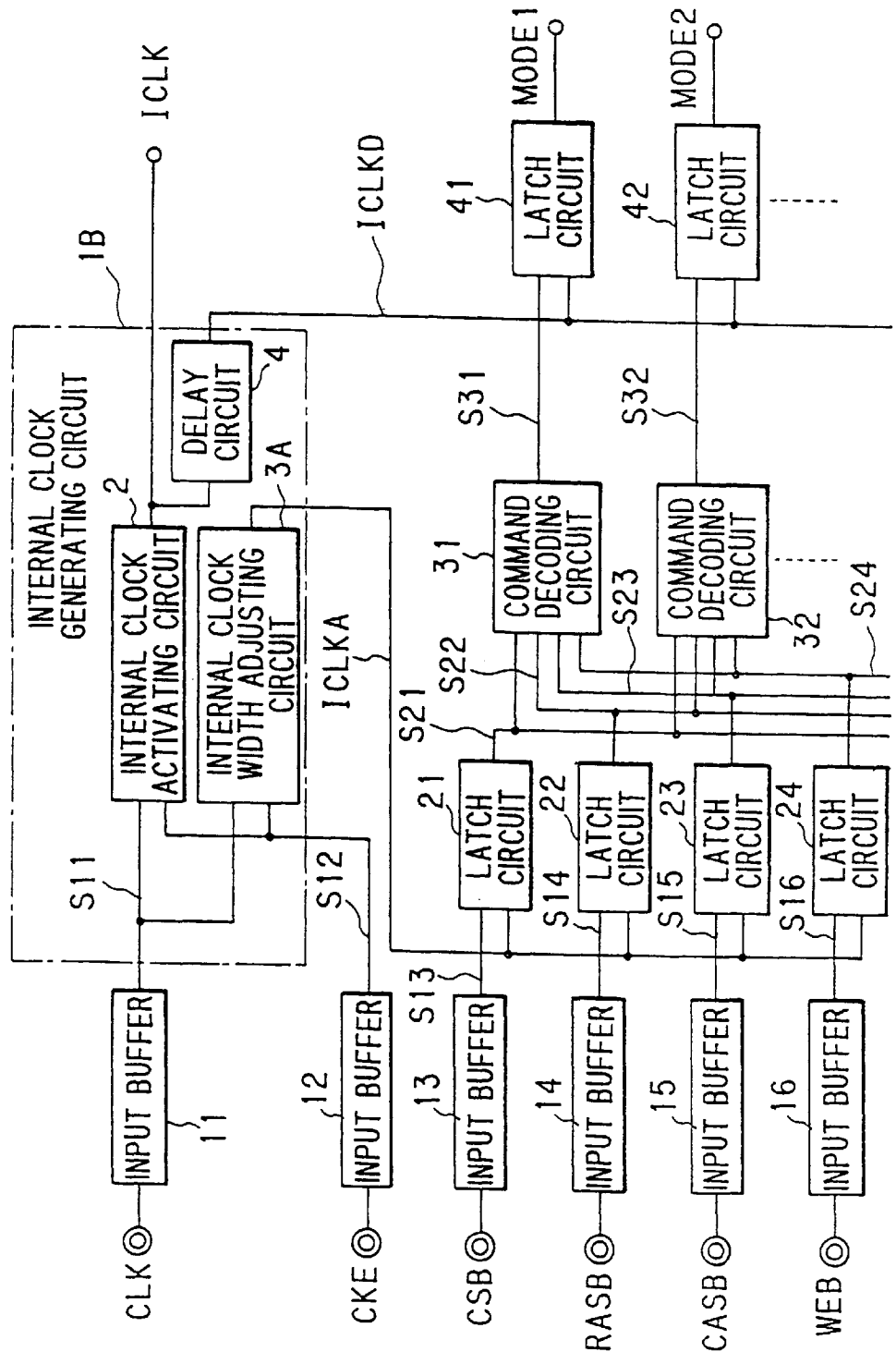
FIG. 9 is a block diagram showing a semiconductor memory device in a second preferred embodiment according to the invention.
Figure 10:
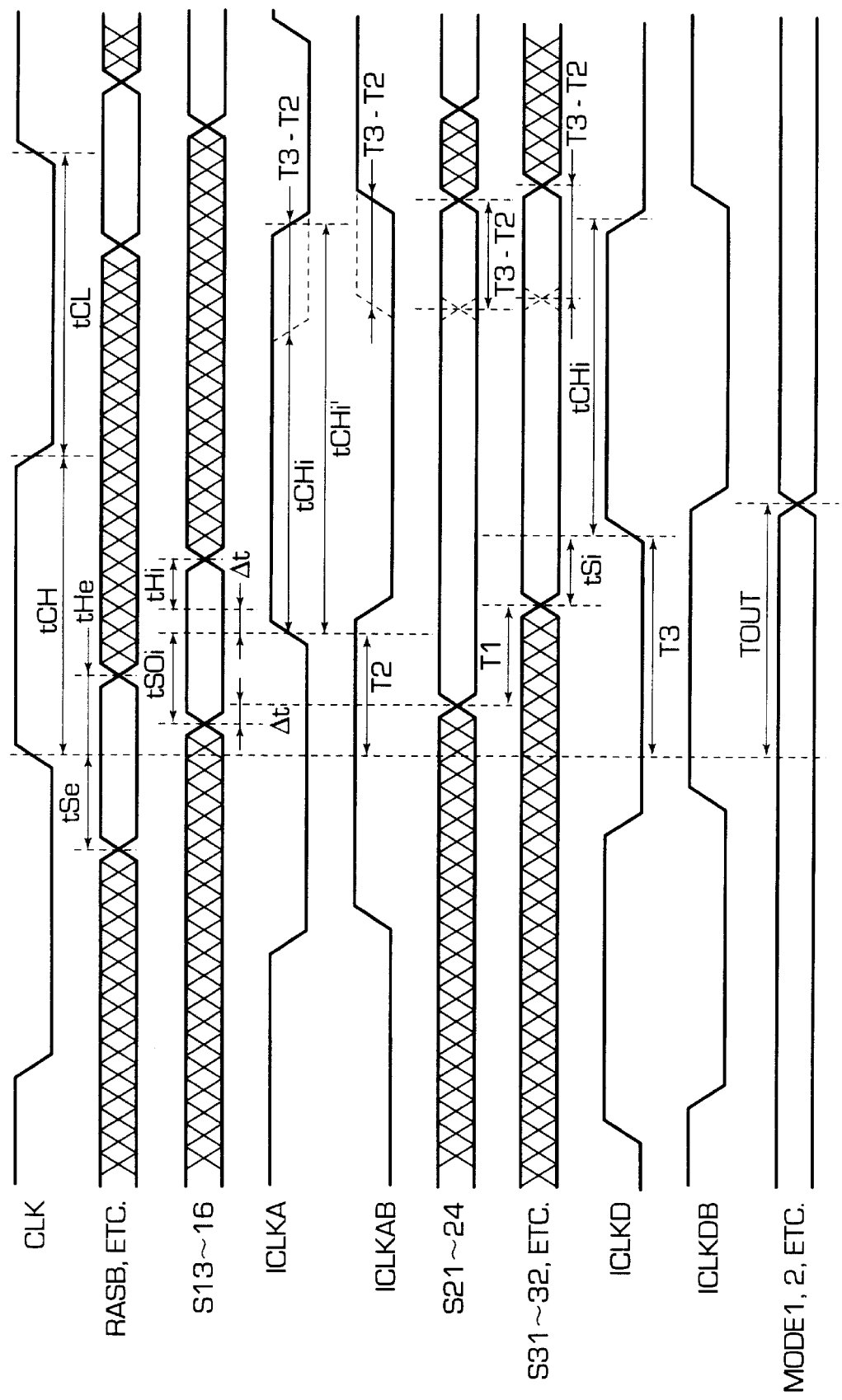
FIG. 10 is a time chart showing the operation of the semiconductor memory device in the second embodiment.

Referring to FIGS. 9 and 10, the operation of the semiconductor memory device in the second embodiment will be explained below. FIG. 10 is a time chart showing the operation waveforms of the respective signals.

First, the input buffer 11 of the internal clock generating circuit 1B receives the external clock CLK, and then outputs clock S11. The internal clock activating circuit 2 is activated in response to High level of the output signal S12 of the input buffer 12 supplied with the external clock enable signal CKE, receiving clock S11, then outputting the internal clock ICLK to synchronize with clock S11 to the internal circuit and the delay circuit 4.

The delay circuit 4 delays clock ICLK for a predetermined delay time, outputting the delayed internal clock ICLKD.

The clock width adjusting circuit 3A receives clock S11, generating clock ICLKA while adjusting the width of High level part, i.e., pulse width, to be longer than those of the internal clock ICLK and the delayed internal clock ICLKD as well as synchronizing with clock S11, then outputting it to the latch circuits 21 to 24. The specific operation and value in the adjusting of pulse width will be explained later.

Then, the input buffers 13 to 16 receive the respective command control signals CSB, RASB, CASB and WEB and then output the corresponding internal signals S13 to S16. The latch circuits 21 to 24 latch and hold the internal signals S13 to S16 while synchronizing with the rising edge of clock ICLKA supplied, and then output the internal signals S21 to S24 to the command decoding circuits 31, 32, . . . .

Subsequently, like the first embodiment, the command decoding circuits 31, 32, . . . output the command decode signals S31, S32, . . . that correspond to the combinations of level states of the internal signals S21 to S24 to the latch circuits 41, 42, . . . . The latch circuits 41, 42, . . . latch the command decode signals S31, S32, . . . while synchronizing with the delayed internal clock ICLKD, and then output the corresponding operation mode judgement signals MODE1, MODE2, . . . .

Meanwhile, the master-side latch circuits 21 to 24 set an internal hold time tHi while synchronizing with clock CLKA, and the slave-side latch circuits 41, 42, . . . set an internal setup time tSi while synchronizing with the delayed internal clock ICLKD. Thereby, the latch circuits 21 to 24 adjust a time until latching the internal signals S13 to S16 to be equal.

Like the first embodiment, the respective external command control signals CSB, RASB, CASB and WEB are input with having an external setup time tSe and an external hold time tHe to the external clock CLK. Thus, signals S13 to S16 are varied delaying by a buffer delay Ta in the input buffers 13 to 16 to each of the external command control signals CSB, RASB, CASB and WEB.

Then, as described earlier, signals S13 to S16 are latched and held by the latch circuits 21 to 24 while synchronizing with the rising edge of clock ICLKA, and then are output as the latch signals S21 to S24. The latch signals S21 to S24 are decoded by the command decoding circuits 31, 32, . . . , and then are output as the command decode signals S31, S32, . . . to the slave-side latch circuits 41, 42, . . . .

Meanwhile, the command decode signals S31, S32, . . . are varied delaying by a latch delay Δt in passing through the master-side latch circuits 21 to 24 and a decode time T1 of the command decoding circuits 31, 32, . . . . Then, the slave-side latch circuits 41, 42, . . . , as described earlier, latch these command decode signals S31, S32, . . . while synchronizing with the delayed internal clock ICLKD and output the operation mode judgement signals MODE1, MODE2, . . . .

The clock width adjusting circuit 3A adjusts the High level width tCHi' of clock ICLKA to the High level width tCHi of the internal clock ICLK and the delayed internal clock ICLKD so as to satisfy the follow expression:

$$tCHi' \geq tCHi+T3-T2 \quad [23]$$

where T2 represents a delay time from the external clock CLK to clock ICLKA, and T3 represents a delay time from the external clock CLK to the delayed internal clock ICLKD.

Like the first embodiment, the internal setup width must be restricted by the correction internal setup time tS0i. Therefore, when the internal setup width is set by using the internal setup time tSi, it needs to satisfy expression 12:

$$tSi-tS0i \leq 0 \quad [12]$$

From the above relations, by setting the difference (T3−T2) between the delay times T3 and T2 to satisfy the following expressions 24A, 24B, expressions 14, 15 can be established like the first embodiment, therefore the internal window width tWi can be made to be longer than conventional one, as shown in expression 16.

$$T3-T2=T1+\Delta t \quad [24A]$$

$$tCHi' \geq tCHi+T1+\Delta t \quad [24B]$$

$$tSe+tHe=tS0i+\Delta t+tHi \quad [14]$$

$$tSe+tHe=tSi+tHi+\Delta t \quad [15]$$

$$tWi = tWe - \Delta t \quad [16]$$

On the other hand, the operation mode judgement time Tout is given by the following expression 25, and it is, by the decode time T1, shorter than the shortest time in the conventional techniques.

$$Tout = T2 + \Delta t + T1 \quad [25]$$

Also, by setting the difference (T3−T2) between the delay times T3 and T2 to satisfy the following expressions 26A, 26B, expressions 19, 20 can be established like the first embodiment, therefore the internal window width tWi can be obtained as shown in expression 21.

$$T3 - T2 = T1 + \Delta t - t\alpha \quad [26A]$$

$$tCHi' = tCHi + T3 - T2 \quad [26B]$$

$$tSe + tHe = tS0i + \Delta t + tHi \quad [19]$$

$$tSe + tHe = tSi + t\alpha + tHi + \Delta t \quad [20]$$

$$tWi = tWe - (\Delta t + t\alpha) \quad [21]$$

where tα represents an arbitrary time.

On the other hand, the operation mode judgement time Tout is given by:

$$Tout = T2 + \Delta t + T1 - t\alpha \quad [27]$$

Like the first embodiment, there exists a trade-off relation between the internal window width tWi and the operation mode judgement time Tout. Namely, when the internal window width tWi is narrowed, the operation mode judgement time Tout is shortened by the reduced amount, tα. Thus, by adjusting the interrelation between the delay times T3 and T2, i.e., the timings of clock ICLKA and the internal clock ICLK, and the pulse width of clock ICLKA, the internal window width tWi and the operation mode judgement time Tout can be optimized under a certain condition.

Figure 11:
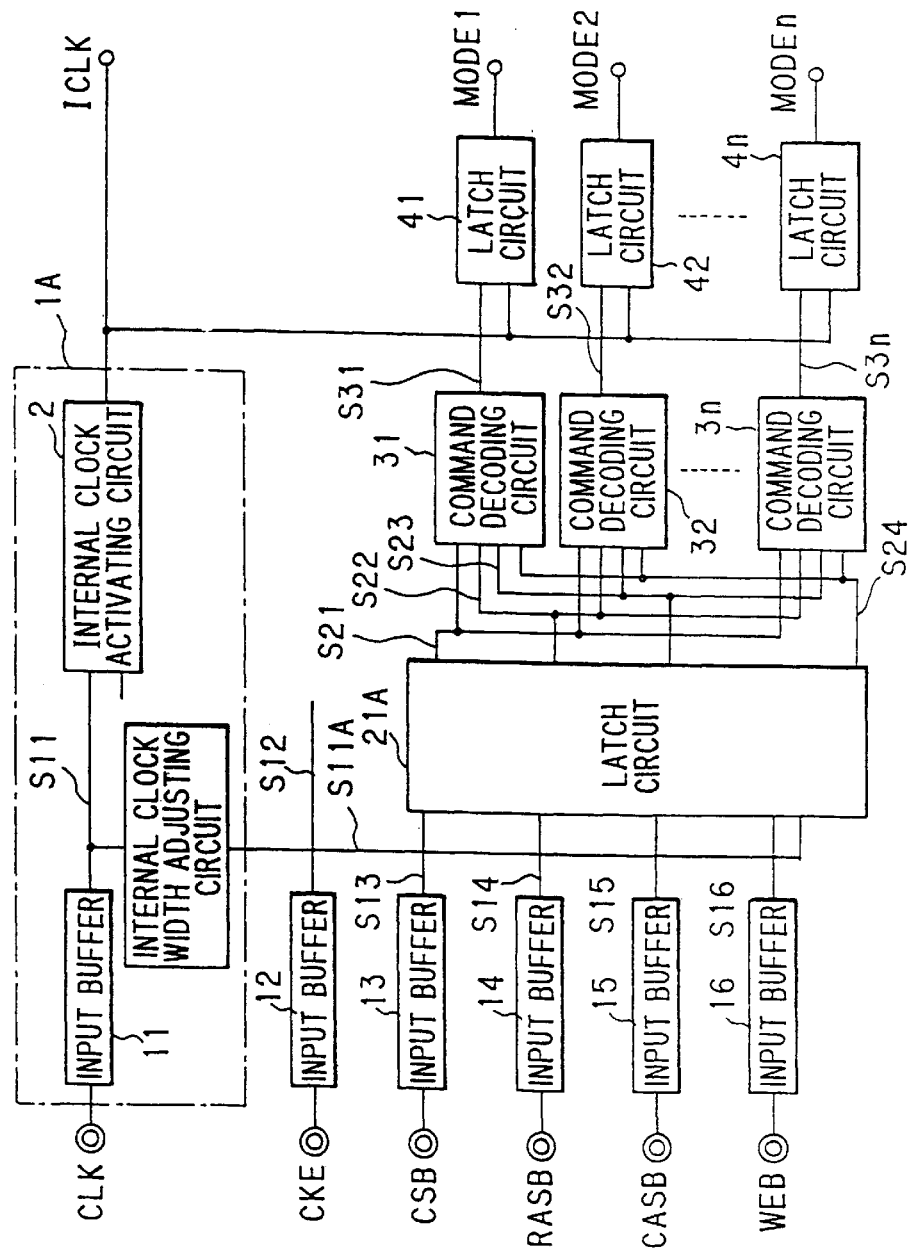
FIG. 11 is a block diagram showing a semiconductor memory device in a third preferred embodiment according to the invention.

A semiconductor memory device in the third preferred embodiment according to the invention will be explained in FIG. 11, wherein like parts are indicated by like reference numerals and letters as used in FIG. 6.

The third embodiment is different from the first embodiment in that it comprises, instead of the latch circuits 21 to 24, a latch circuit 21A that latches and holds the respective internal signals S13 to S16 corresponding to the command control signals CSB, RASB, CASB and WEB and output the corresponding latch signals S21 to S24 while synchronizing with clock S11.

The operation of the third embodiment is similar to that of the first embodiment. In this composition, the latch circuit 21A can easily adjust a time until latching the internal signals S13 to S16 corresponding to the command control signals CSB, RASB, CASB and WEB to be equal.

Figure 12:
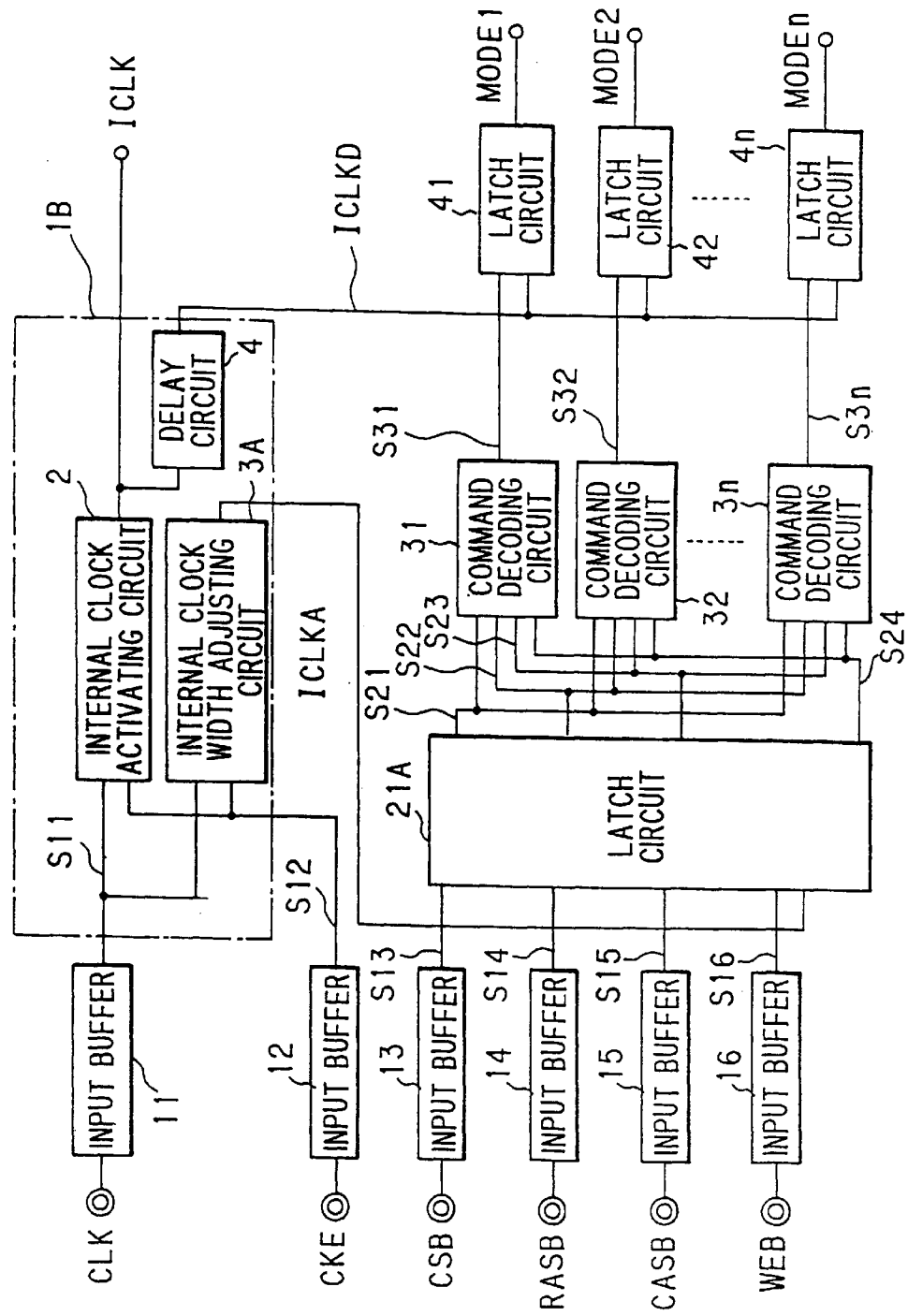
FIG. 12 is a block diagram showing a semiconductor memory device in a fourth preferred embodiment according to the invention.

A semiconductor memory device in the fourth preferred embodiment according to the invention will be explained in FIG. 12, wherein like parts are indicated by like reference numerals and letters as used in FIG. 9.

The fourth embodiment is different from the second embodiment in that it comprises, instead of the latch circuits 21 to 24, a latch circuit 21A that latches and holds the respective internal signals S13 to S16 corresponding to the command control signals CSB, RASB, CASB and WEB and output the corresponding latch signals S21 to S24 while synchronizing with clock ICLKA.

The operation of the fourth embodiment is similar to that of the second embodiment. In this composition, the latch circuit 21A can easily adjust a time until latching the internal signals S13 to S16 corresponding to the command control signals CSB, RASB, CASB and WEB to be equal.

Figure 13:
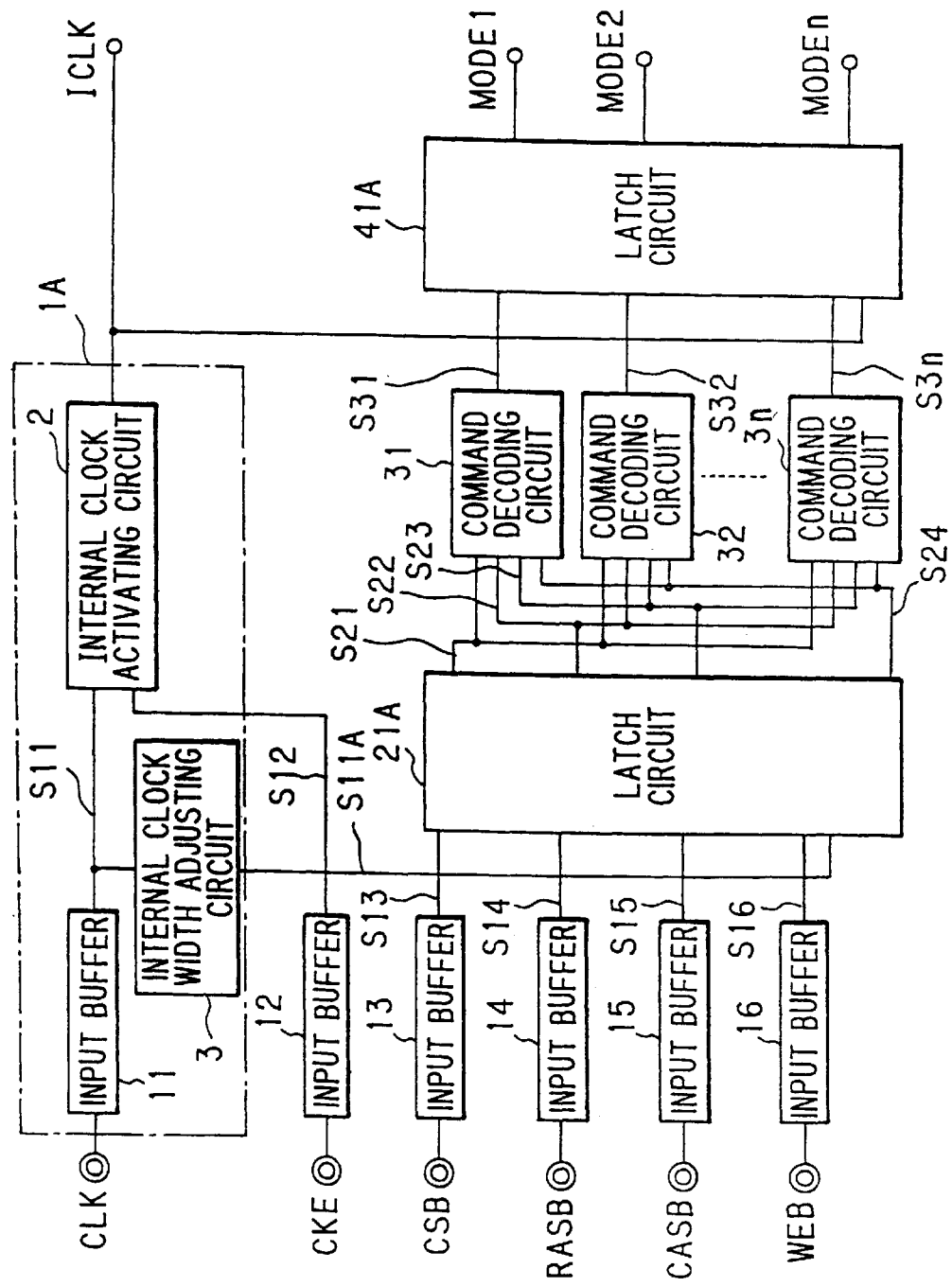
FIG. 13 is a block diagram showing a semiconductor memory device in a fifth preferred embodiment according to the invention.

A semiconductor memory device in the fifth preferred embodiment according to the invention will be explained in FIG. 13, wherein like parts are indicated by like reference numerals and letters as used in FIG. 11.

The fifth embodiment is different from the third embodiment in that it comprises, instead of the latch circuits 41 to 4n, a latch circuit 41A that latches, in the lump, the command decode signals S31 to S3n and output the corresponding operation mode judgement signals MODE1 to MODEn.

The operation of the fifth embodiment is similar to that of the first and second embodiments. In this composition, a time required to the command decoding, i.e., a decode time T1 can be shortened, as well as easily adjusting a time until latching the internal signals S13 to S16 corresponding to the command control signals CSB, RASB, CASB and WEB to be equal.

A semiconductor memory device in the sixth preferred embodiment according to the invention will be explained in FIG. 14, wherein like parts are indicated by like reference numerals and letters as used in FIG. 12.

The sixth embodiment is different from the fourth embodiment in that it comprises, instead of the latch circuits 41 to 4n, a latch circuit 41A that latches, in the lump, the command decode signals S31 to S3n and output the corresponding operation mode judgement signals MODE1 to MODEn.

The operation of the sixth embodiment is similar to that of the second and fourth embodiments. In this composition, a time required to the command decoding, i.e., a decode time T1 can be shortened, as well as easily adjusting a time until latching the internal signals S13 to S16 corresponding to the command control signals CSB, RASB, CASB and WEB to be equal.

Although the invention has been described with respect to specific embodiments for complete and clear disclosure, the appended claims are not to be thus limited but are to be construed as embodying all modification and alternative constructions that may occur to one skilled in the art which fairly fall within the basic teaching here is set forth.

What is claimed is:

1. A semiconductor memory device, comprising:

an internal clock signal generating circuit that generates first and second internal clock signals for internal timing control in response to an external clock;

a first latch circuit that includes a first switching means to operate in synchronization with said first internal clock signal and latches a plurality of command control signals for the internal operation control and outputs a plurality of latch command signals;

a command decoding circuit that decodes said plurality of latch command signals and outputs a plurality of command decode signals; and a second latch circuit that includes a second switching means to operate in synchronization with said second internal clock signal, latches said plurality of command decode signals and outputs a plurality of predetermined mode signals;

wherein said internal clock signal generating circuit comprises a timing setting means for setting a timing between said first and second internal clock signals, and a clock width adjusting means for adjusting a pulse width of said first internal clock signal according to timing of said second internal clock signal, said first latch circuit sets a hold time required from a time that said first switching means is turned on to a time that an input signal of said first latch circuit starts varying from a certain determined level, and said second latch circuit sets a setup time required from a time that an input signal of said second latch circuit reaches a certain determined level to a time that said second switching means starts turning off.

2. A semiconductor memory device, according to claim 1, wherein:

said plurality of command control signals includes an external clock enable signal for enabling said external clock signal, a chip select for activating the memory device, a row address strobe signal for enabling a row address, a column address strobe signal for enabling a column address, and a write enable signal for enabling a write operation.

3. A semiconductor memory device, according to claim 1, wherein:

said internal clock signal generating circuit comprises:

an internal clock signal activating circuit that generates said second internal clock signal in response to an external clock enable signal for enabling said external clock signal while synchronizing with said external clock signal with having a second delay time from said external clock signal; and said clock width adjusting means that generates said first internal clock signal while synchronizing with said external clock signal having a first delay time from said external clock signal and setting said pulse width of said first internal clock signal to be longer than a pulse width of said second internal clock signal.

4. A semiconductor memory device, according to claim 1, wherein:

said first latch circuit comprises a plurality of latch circuits that latch said plurality of command control signals while synchronizing with said first internal clock signal and output the corresponding plurality of latch command signals.

5. A semiconductor memory device, according to claim 1, wherein:

said second latch circuit comprises a plurality of latch circuits that latch said plurality of command decode signals while synchronizing with said second internal clock signal and output the corresponding plurality of predetermined mode signals.

6. The semiconductor memory of claim 1, wherein said first and second latch circuits comprise D-type latches.

7. A semiconductor memory device, according to claim 1, wherein:

said internal clock signal generating circuit comprises:

an internal clock signal activating circuit that generates a third internal clock signal in response to an external clock enable signal for enabling said external clock signal while synchronizing with said external clock signal;

a delay circuit that generates said second internal clock signal while delaying said third internal clock signal and setting a second delay time from said external clock signal; and said clock width adjusting means that generates said first internal clock signal while synchronizing with said external clock signal having a first delay time from said external clock signal and setting said pulse width of said first internal clock signal to be longer than a pulse width of said second internal clock signal.

8. The semiconductor memory device of claim 7, wherein a time between said external clock and said third clock signal corresponds to a first factor, wherein a time between said external clock and said second internal clock corresponds to a second factor, and wherein a difference between said first and second factors is equal to a sum of 1) a delay time of said first latch circuit and 2) a reference interval, wherein the reference interval corresponds to a start time of the command decoding circuit and a start time of the first latch circuit delayed by the delay time of the first latch circuit.

9. The semiconductor memory device of claim 8 wherein a high level of said first internal clock signal exceeds a high level interval of said second internal clock signal by at least an amount which is a sum of the delay time of the first latch circuit and said reference interval.

10. The semiconductor memory device of claim 7, wherein a time between said external clock and said third clock signal corresponds to a first factor, wherein a time between said external clock and said second internal clock corresponds to a second factor, and wherein a difference between said first and second factors is equal to a sum of 1) a delay time of said first latch circuit, 2) a reference interval, wherein the reference interval corresponds to a start time of the command decoding circuit and a start time of the first latch circuit delayed by the delay time of the first latch circuit, and 3) an arbitrary interval which is less that the delay time of the first latch circuit.

11. The semiconductor memory device of claim 10 wherein a high level of said first internal clock signal exceeds a high level interval of said second internal clock signal by at least an amount which is a sum of the delay time of the first latch circuit, said reference interval and said delay interval.

* * * * *